(12) United States Patent
Eom et al.

(10) Patent No.: US 12,245,488 B2
(45) Date of Patent: Mar. 4, 2025

(54) ELECTRONIC DEVICE

(71) Applicant: Samsung Display Co., Ltd., Yongin-si (KR)

(72) Inventors: Cheolhwan Eom, Anyang-si (KR); Deok-Young Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 17/454,013

(22) Filed: Nov. 8, 2021

(65) Prior Publication Data

US 2022/0254835 A1 Aug. 11, 2022

(30) Foreign Application Priority Data

Feb. 8, 2021 (KR) .................. 10-2021-0017452

(51) Int. Cl.
*H10K 59/40* (2023.01)
*G06F 3/044* (2006.01)
*H10K 59/131* (2023.01)

(52) U.S. Cl.
CPC ........... *H10K 59/40* (2023.02); *G06F 3/0446* (2019.05); *H10K 59/131* (2023.02)

(58) Field of Classification Search
CPC .. G06F 3/0446; G06F 3/0412; G06F 3/04164; G06F 2203/04102; H10K 59/40; H10K 59/131; H10K 50/8423; H10K 59/00; H10K 59/65; H10K 50/84; H10K 77/111; H01L 27/124; H01L 27/156
See application file for complete search history.

(56) References Cited

U.S. PATENT DOCUMENTS

| 9,048,444 | B2 | 6/2015 | Kim et al. |
| 10,490,770 | B2 | 11/2019 | Kim et al. |
| 11,150,754 | B2 | 10/2021 | Lee et al. |
| 2017/0142837 | A1* | 5/2017 | Kim ...................... H05K 1/147 |
| 2018/0061897 | A1* | 3/2018 | Oh ....................... H10K 50/844 |

(Continued)

FOREIGN PATENT DOCUMENTS

| CN | 103165623 A | 6/2013 |
| KR | 10-0283195 B1 | 3/2001 |

(Continued)

*Primary Examiner* — Moazzam Hossain
(74) *Attorney, Agent, or Firm* — Lewis Roca Rothgerber Christie LLP

(57) ABSTRACT

An electronic device includes a display panel including a bending portion, a first non-bending portion, and a second non-bending portion spaced from the first non-bending portion with the bending portion therebetween in a first direction, an input sensing part on the first non-bending portion, and including a sensing electrode, a signal line on the second non-bending portion, electrically connected to the sensing electrode, and including a first portion extending substantially parallel to the first direction, and a second portion extending in a second direction that is different from the first direction, and located between the sensing electrode and the first portion, an electronic part on the second non-bending portion, and not overlapping the signal line, and a reinforcing member on the second non-bending portion, at least partially surrounding the electronic part, and overlapping the first portion while not overlapping the second portion in a plan view.

20 Claims, 10 Drawing Sheets

(56) References Cited

U.S. PATENT DOCUMENTS

2020/0136069 A1\*  4/2020  Paek ................... B32B 27/285
2020/0204924 A1\*  6/2020  Kim ..................... H04R 1/028

FOREIGN PATENT DOCUMENTS

| KR | 10-0847003 B1 | 7/2008 |
| KR | 10-1092651 B1 | 12/2011 |
| KR | 10-2017-0058508 | 5/2017 |
| KR | 10-2018-0025023 | 3/2018 |
| KR | 10-2018-0029190 A | 3/2018 |
| KR | 10-2019-0140129 | 12/2019 |
| KR | 10-2089246 B1 | 3/2020 |

\* cited by examiner

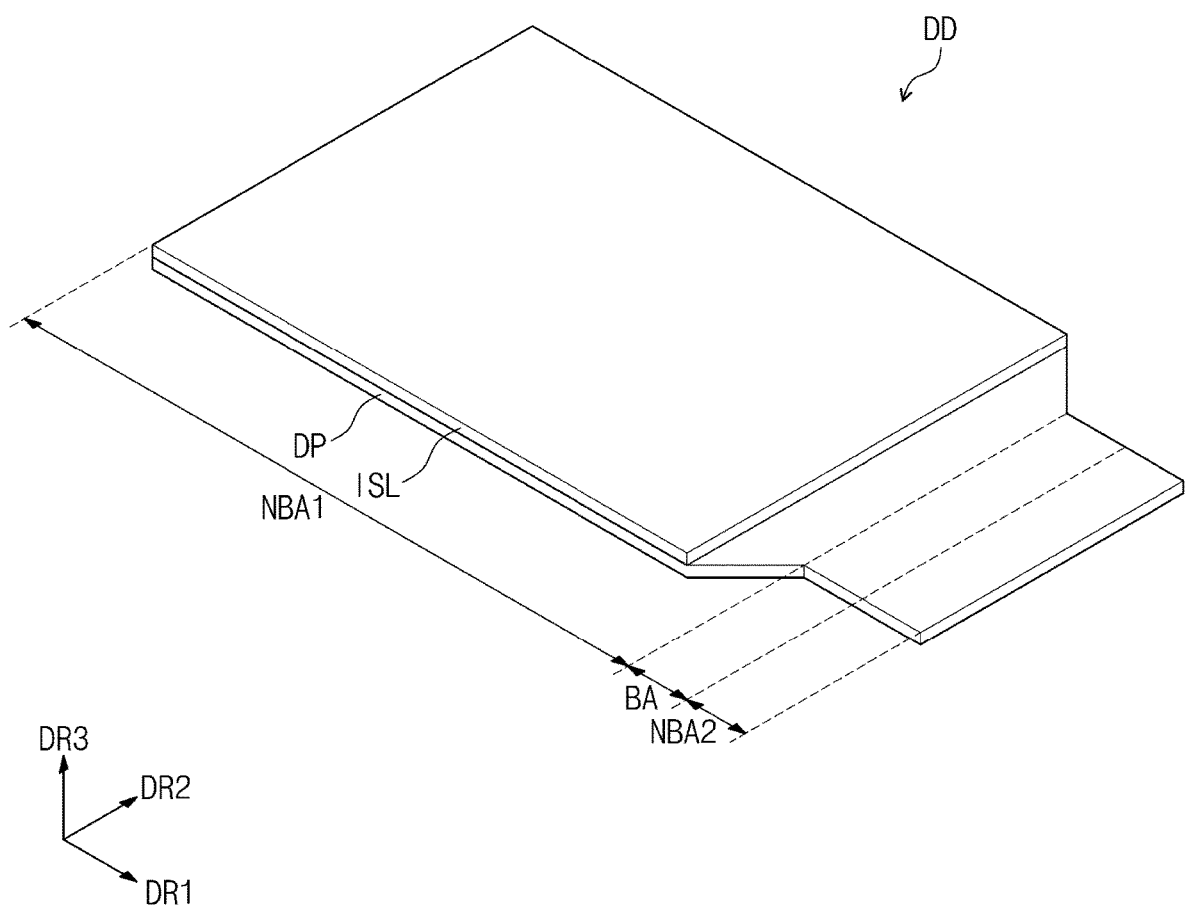

ELECTRONIC DEVICE

CROSS-REFERENCE TO RELATED APPLICATION

This application claims priority to, and the benefit of, Korean Patent Application No. 10-2021-0017452, filed on Feb. 8, 2021, the contents of which are hereby incorporated by reference in its entirety.

BACKGROUND

1. Field

The present disclosure relates to an electronic device including a reinforcing member.

2. Description of the Related Art

An electronic device, such as a display device, is activated in response to electrical signals applied thereto. The electronic device includes devices including various electronic elements, such as a display unit displaying an image and an input sensing unit sensing an external input. The electronic elements are electrically connected to each other via a plurality of signal lines. In addition, the electronic device includes a protective member to protect the electronic elements.

The signal lines are arranged in various ways according to arrangements of the electronic elements and the protective member, and are designed to reduce or prevent an interference of electrical signals in a corresponding area. However, defects may occur in the signal lines due to a contact between the signal lines and the protective member.

SUMMARY

The present disclosure provides an electronic device capable of reducing defects of signal lines thereof.

Embodiments of the present disclosure provide an electronic device including a display panel including a bending portion, a first non-bending portion, and a second non-bending portion spaced apart from the first non-bending portion with the bending portion interposed therebetween in a first direction, an input sensing part on the first non-bending portion, and including a sensing electrode, a signal line on the second non-bending portion, electrically connected to the sensing electrode, and including a first portion extending in a first extension direction substantially parallel to the first direction, and a second portion extending in a second extension direction that is different from the first extension direction, and located between the sensing electrode and the first portion, an electronic part on the second non-bending portion, and not overlapping the signal line, and a reinforcing member on the second non-bending portion, at least partially surrounding the electronic part, and overlapping the first portion while not overlapping the second portion in a plan view.

The reinforcing member may include inner side surfaces adjacent to the electronic part, and outer side surfaces respectively opposite to the inner side surfaces, one of the outer side surfaces defining a groove portion concavely defined toward a direction of a corresponding one of the inner side surfaces.

The groove portion may be defined by two short sides substantially perpendicular to the one of the outer side surfaces, and one long side substantially perpendicular to the two short sides in a plan view.

The first portion may cross the long side.

The electronic part may have a rectangular pillar shape including four side surfaces, wherein respective the inner side surfaces of the reinforcing member are adjacent to three of the four side surfaces of the electronic part.

At least one of the outer side surfaces of the reinforcing member in which the groove portion is not defined may include a first edge extending substantially in the first direction, and a second edge inclined with respect to the first edge in a plan view, wherein an inclination angle of the second edge with respect to an extension line of the first edge is greater than about 0° and smaller than about 90°.

An angle between the first extension direction and the second extension direction may be equal to or greater than about 90° and smaller than about 180°.

The signal line may include a first conductive layer on the display panel, a second conductive layer on the first conductive layer, and a third conductive layer covering an upper surface of the second conductive layer and at least a portion of a side surface of the second conductive layer.

The third conductive layer may cover about 30% or more of a total area of one side surface of the second conductive layer.

The second conductive layer may include aluminum, wherein the first conductive layer and the third conductive layer include titanium.

The third conductive layer may have a thickness that is substantially equal to or greater than a thickness of the first conductive layer in a thickness direction that is normal to a plan view.

The electronic device may further include a cover member on the electronic part and having an area that is greater than an area of the electronic part in a plan view.

An edge of the cover member may overlap the reinforcing member.

The reinforcing member may include a stainless steel.

The reinforcing member may have a shape that is symmetrical with respect to an imaginary line extending substantially parallel to the first direction and crossing a center of the reinforcing member.

The sensing electrode may include a first sensing electrode, and a second sensing electrode insulated from the first sensing electrode while crossing the first sensing electrode, wherein the signal line includes a first signal line electrically connected to the first sensing electrode, and a second signal line electrically connected to the second sensing electrode.

The first portion of the first signal line may be adjacent to a first side of the electronic part, wherein the first portion of the second signal line is adjacent to a second side of the electronic part.

The reinforcing member may include inner side surfaces adjacent to the electronic part, and outer side surfaces opposite to the inner side surfaces, wherein one of the outer side surfaces defines a first groove portion concavely defined therein toward a direction of a corresponding one of the inner side surfaces, and a second groove portion spaced apart from the first groove portion in a second direction, wherein the first signal line overlaps the first groove portion, wherein the second signal line overlaps the second groove portion, and wherein the second direction is substantially perpendicular to the first direction.

Embodiments of the present disclosure provide an electronic device including a display panel including a bending portion, a first non-bending portion, and a second non-bending portion spaced apart from the first non-bending portion with the bending portion interposed therebetween in a first direction, an input sensing part on the first non-bending portion, and including a sensing electrode, a signal line on the second non-bending portion, electrically connected to the sensing electrode, and including a first portion extending in the first direction and a second portion extending in a second direction that is different from the first direction, an electronic part on the second non-bending portion while not overlapping the signal line, and a reinforcing member on the second non-bending portion, and overlapping the first portion while not overlapping the second portion, wherein the signal line includes a first conductive layer on the display panel, a second conductive layer on the first conductive layer, and a third conductive layer covering an upper surface of the second conductive layer and at least a portion of a side surface of the second conductive layer.

The reinforcing member may include inner side surfaces adjacent to the electronic part, and outer side surfaces respectively opposite to the inner side surfaces, one of the outer side surfaces defining a groove portion concavely defined toward a direction of a corresponding one of the inner side surfaces, the groove portion overlapping the first portion.

According to the above, the electronic device includes the reinforcing member that does not overlap the portion of the signal line, and thus, the reliability of the electronic device is improved.

BRIEF DESCRIPTION OF THE DRAWINGS

The above and other aspects of the present disclosure will become readily apparent by reference to the following detailed description when considered in conjunction with the accompanying drawings wherein:

FIG. 3A is a perspective view showing a portion of an electronic device according to some embodiments of the present disclosure;

DETAILED DESCRIPTION

Figure 1:
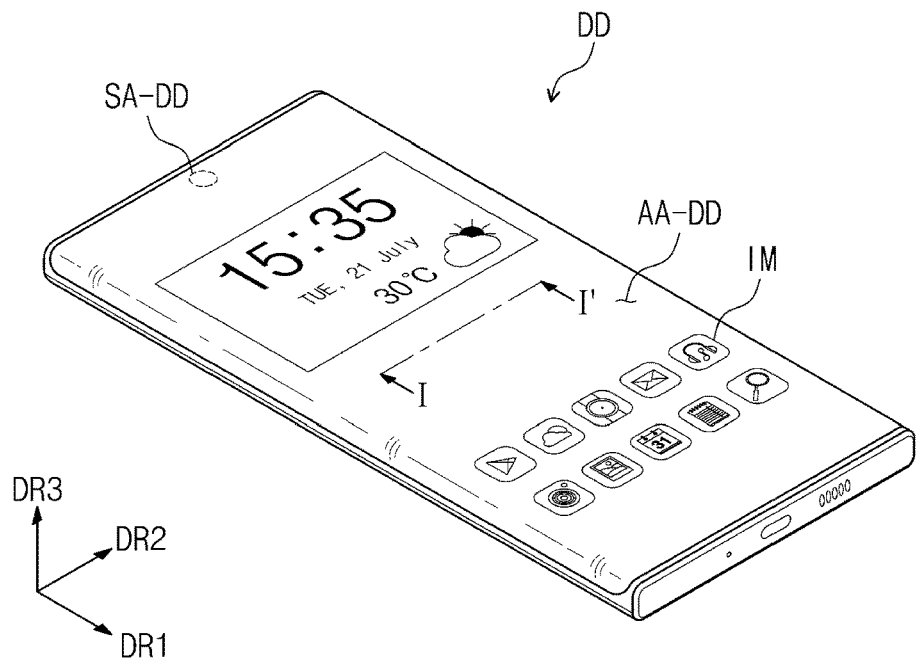
FIG. 1 is a perspective view showing an electronic device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
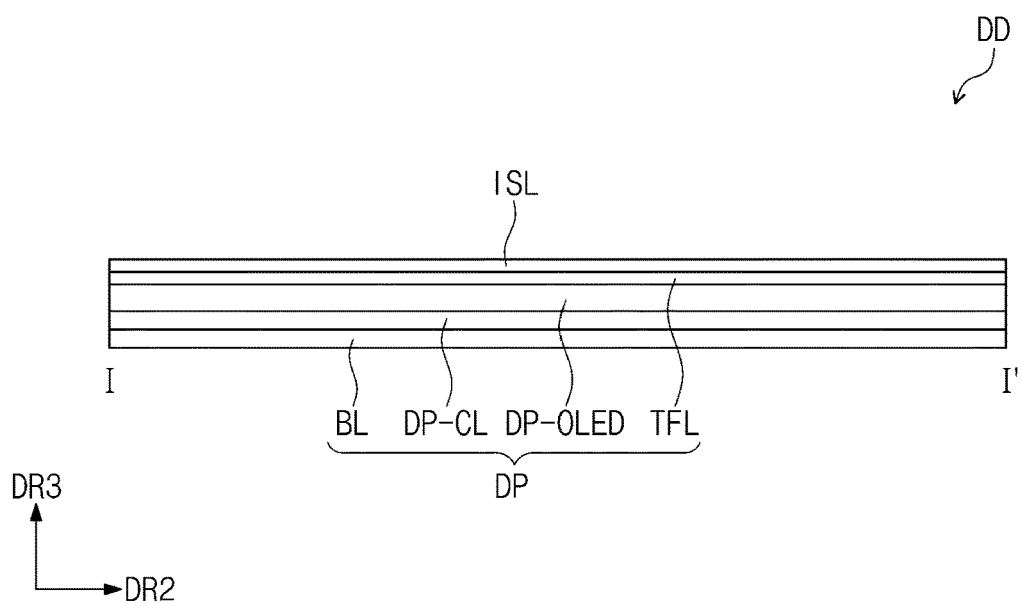
FIG. 2 is a cross-sectional view taken along the line I-I' of FIG. 1.
Figure 3B:
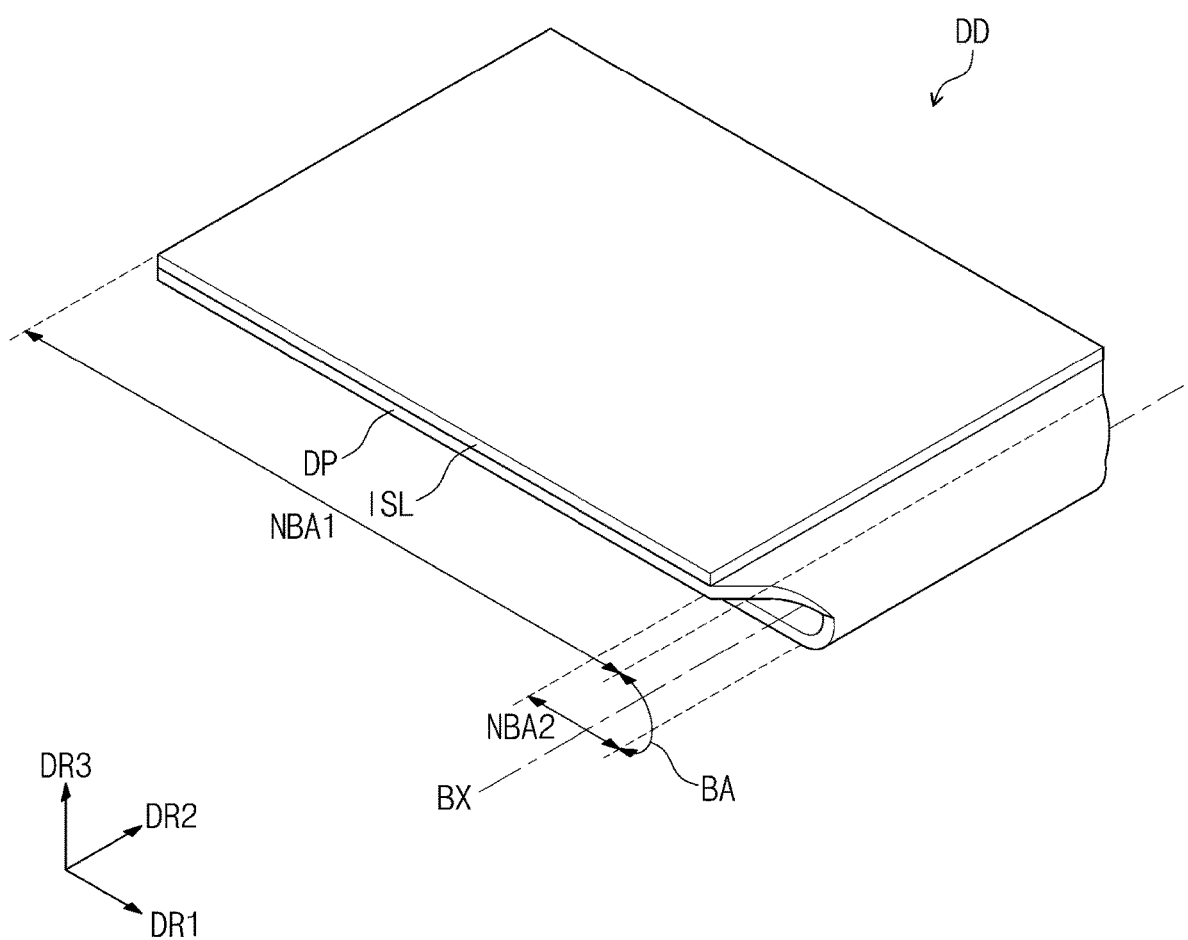
FIG. 3B is a perspective view showing a portion of an electronic device according to some embodiments of the present disclosure.
Figure 4:
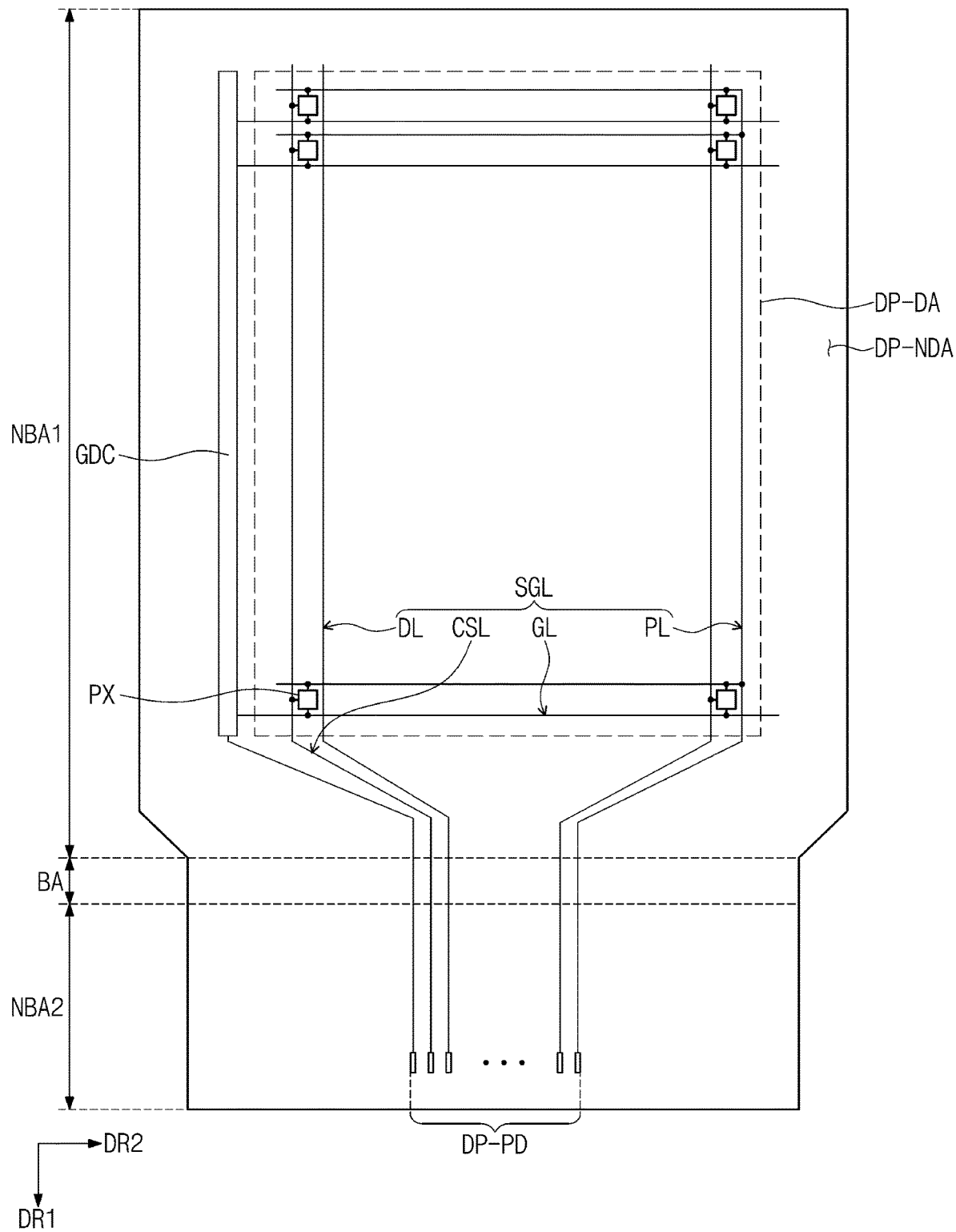
FIG. 4 is a plan view showing a portion of an electronic device according to some embodiments of the present disclosure.
Figure 5:
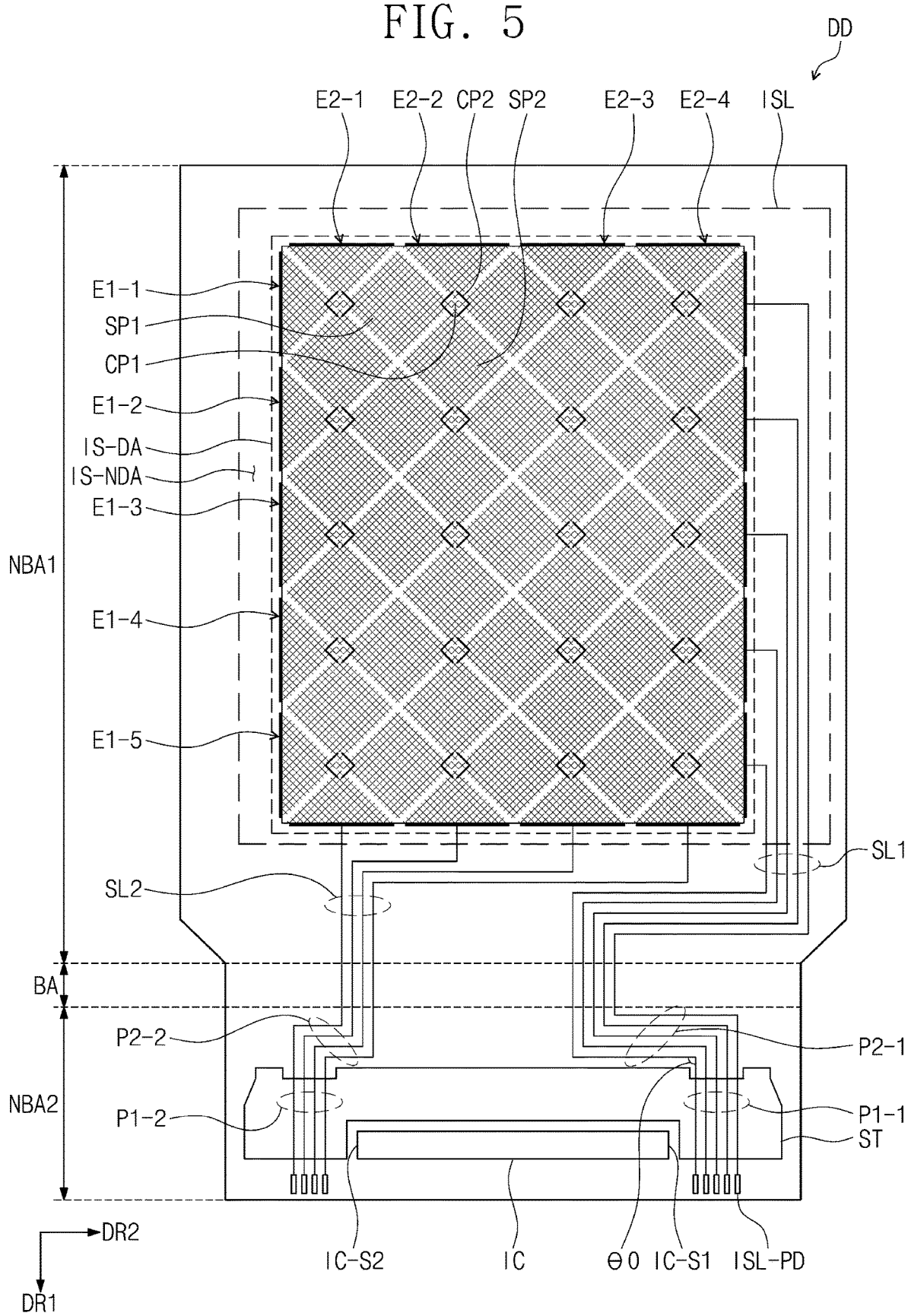
FIG. 5 is a plan view showing a portion of an electronic device according to some embodiments of the present disclosure.
Figure 6:
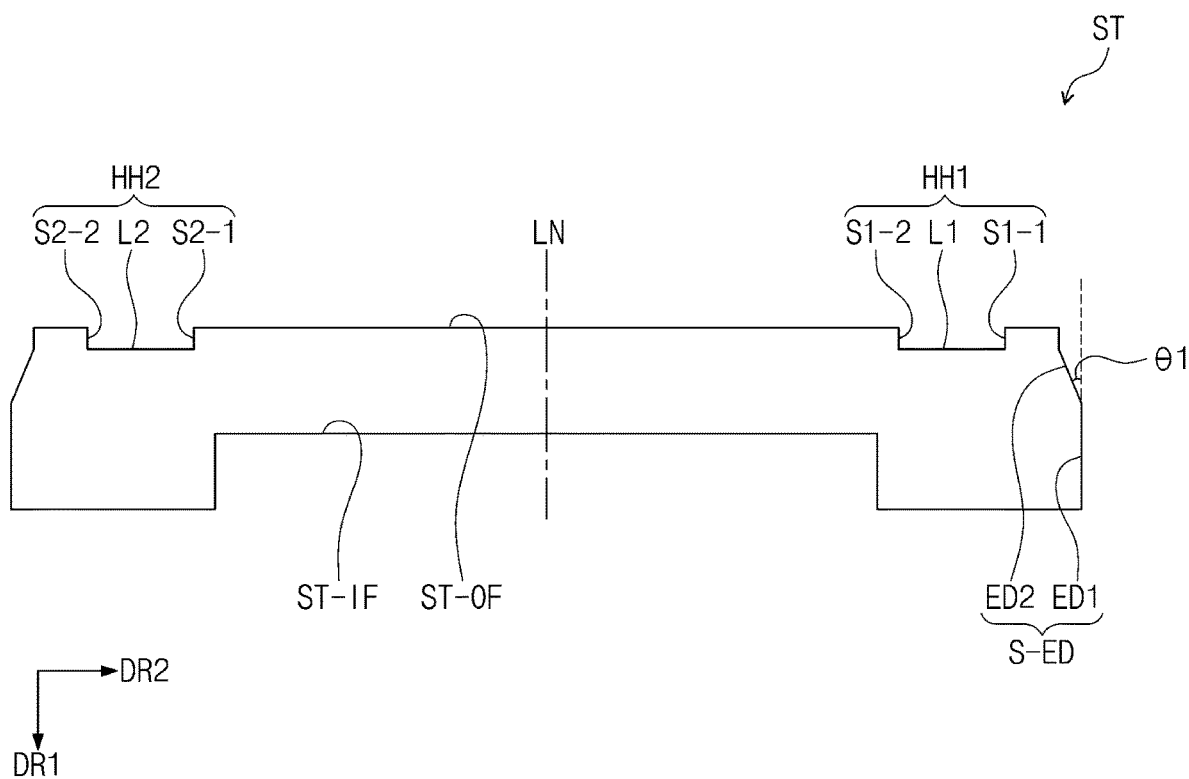
FIG. 6 is a plan view showing a reinforcing member according to some embodiments of the present disclosure.
Figure 7:
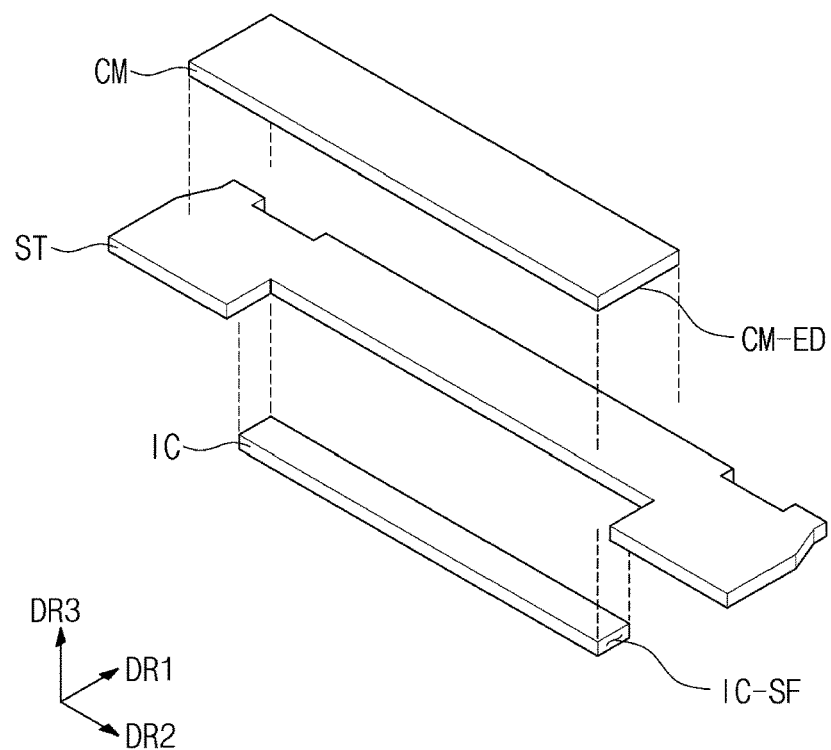
FIG. 7 is a perspective view showing a portion of an electronic device according to some embodiments of the present disclosure.

FIG. 1 is a perspective view showing an electronic device DD according to some embodiments of the present disclosure. FIG. 2 is a cross-sectional view taken along the line I-I' of FIG. 1. FIG. 3A is a perspective view showing a portion of the electronic device DD according to some embodiments of the present disclosure. FIG. 3B is a perspective view showing a portion of the electronic device DD according to some embodiments of the present disclosure. FIGS. 4 and 5 are plan views showing a portion of the electronic device DD according to some embodiments of the present disclosure. FIG. 6 is a plan view showing a portion of the electronic device according to some embodiments of the present disclosure. FIG. 7 is a perspective view showing a portion of the electronic device according to some embodiments of the present disclosure.

Referring to FIG. 1, the electronic device DD may be a device that is activated in response to electrical signals. For example, the electronic device DD may be a mobile phone, a tablet computer, a car navigation unit, a game unit, or a wearable device, however, it should not be limited thereto or thereby. In FIG. 1, the mobile phone will be described as the electronic device DD according to some embodiments.

The electronic device DD may display an image IM through an active area AA-DD. The active area AA-DD may include a plane, or a planar surface, defined by a first directional axis DR1 and a second directional axis DR2. The active area AA-DD may further include a curved surface bent from one side of the planar surface defined by the first directional axis DR1 and the second directional axis DR2. The electronic device DD shown in FIG. 1 may include two curved surfaces respectively bent from opposite sides of the planar surface defined by the first directional axis DR1 and the second directional axis DR2. However, the shape of the active area AA-DD should not be limited thereto or thereby. For example, the active area AA-DD may include only the planar surface. According to some embodiments, the active area AA-DD may include four curved surfaces respectively bent from four sides of the planar surface.

The electronic device DD of the present disclosure may be flexible. The term "flexible" used herein refers to the property of being able to be bent (e.g., from a structure that is completely bent to a structure that is bent at the scale of a few nanometers). For example, the electronic device DD may be a foldable electronic device. According to some embodiments, the electronic device DD may be rigid.

A thickness direction of the electronic device DD may be substantially parallel to a third directional axis DR3 that is a normal line direction with respect to, or that is normal to, the plane defined by the first directional axis DR1 and the second directional axis DR2. In the present disclosure, directions indicated by the first, second, and third directional axes DR1, DR2, and DR3 may be relative to each other, and may be changed to other directions. In addition, directions indicated by the first, second, and third directional axes DR1, DR2, and DR3 may be referred to as first, second, and third directions, respectively, and the first, second, and third directions may be assigned with the same reference numerals as the first, second, and third directional axes DR1, DR2, and DR3. In the present disclosure, the first and second directional axes DR1 and DR2 may be substantially perpendicular to each other, and the third directional axis DR3 may be the normal line direction with respect to the plane defined by the first directional axis DR1 and the second directional axis DR2.

The electronic device DD may include a sensing area SA-DD defined in the active area AA-DD. FIG. 1 shows one sensing area SA-DD, however, the number of the sensing areas SA-DD should not be limited thereto or thereby. The sensing area SA-DD may be a portion of the active area AA-DD. The electronic device DD may display an image through the sensing area SA-DD.

Referring to FIG. 2, the electronic device DD may include a display panel DP, and an input sensing part ISL located on the display panel DP. In addition, in other embodiments, the electronic device DD may further include a support member located under the display panel DP, an anti-reflective member located on the input sensing part ISL, and/or a window member.

The display panel DP may be a light emitting type display panel, however, it should not be particularly limited. As an example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a micro-LED. Hereinafter, the organic light emitting display panel will be described as the display panel DP according to some embodiments.

The display panel DP may include a base layer BL, a circuit layer DP-CL, a display element layer DP-OLED, and an encapsulation layer TFL, which are sequentially stacked one on another. The input sensing part ISL may be located directly on the encapsulation layer TFL.

The base layer BL may include at least one plastic film. The base layer BL may be a flexible substrate and may include a plastic substrate, a glass substrate, a metal substrate, or an organic/inorganic composite substrate. The circuit layer DP-CL may include at least one insulating layer and a circuit element. The insulating layer may include at least one inorganic layer and at least one organic layer. The display element layer DP-OLED may include a plurality of organic light emitting diodes. The display element layer DP-OLED may further include a pixel definition layer. The encapsulation layer TFL may encapsulate the display element layer DP-OLED. The encapsulation layer TFL may protect the display element layer DP-OLED from foreign substances, such as moisture, oxygen, dust particles, etc.

Referring to FIGS. 3A and 3B, the display panel DP may include a bending portion BA, a first non-bending portion NBA1 adjacent to the bending portion BA, and a second non-bending portion NBA2 adjacent to the bending portion BA. The first non-bending portion NBA1 and the second non-bending portion NBA2 may be spaced apart from each other with the bending portion BA interposed therebetween with respect to a direction in which the first directional axis DR1 extends. That is, the first non-bending portion NBA1, the bending portion BA, and the second non-bending portion NBA2 may be arranged in the first directional axis DR1. When viewed in a plane defined by the first directional axis DR1 and the second directional axis DR2, the first non-bending portion NBA1 may have a width greater than a width of the bending portion BA and greater than a width of the second non-bending portion NBA2. The width of the first non-bending portion NBA1, the width of the bending portion BA, and the width of the second non-bending portion NBA2 may be substantially parallel to the second directional axis DR2. The width of the bending portion BA may be the same as the width of the second non-bending portion NBA2. According to some embodiments, the width of the bending portion BA may be smaller than the width of the second non-bending portion NBA2.

One end of the second non-bending portion NBA2 may be located adjacent to the bending portion BA, and the other end of the second non-bending portion NBA2 may be coupled with a circuit board. The circuit board may be a flexible circuit board.

The input sensing part ISL may be located on the first non-bending portion NBA1. When viewed in the plane defined by the first directional axis DR1 and the second directional axis DR2, the input sensing part ISL may have an area that is smaller than an area of the first non-bending portion NBA1.

Different from FIG. 3A, FIG. 3B shows the display panel DP in which the bending portion BA is bent. The bending portion BA may be bent with respect to a bending axis BX that is substantially parallel to the second directional axis DR2. In the display panel DP in which bending portion BA is bent, the first non-bending portion NBA1 may face, or may be opposite to, the second non-bending portion NBA2. In other embodiments, a coating layer may be located on one surface of the bending portion BA. The coating layer may reduce or prevent the likelihood of the bending portion BA being cracked while being bent, and may allow the bending portion BA to be suitably bent.

FIG. 4 is a plan view showing the display panel DP, and the display panel DP may include a display area DP-DA and a non-display area DP-NDA. The non-display area DP-NDA may be defined along an edge of the display area DP-DA. The display area DP-DA may be defined in the first non-bending portion NBA1.

The display panel DP may include a driving circuit GDC, a plurality of signal transmission lines SGL, and a plurality of pixels PX. The pixels PX may be located in the display area DP-DA. Each of the pixels PX may include the organic light emitting diode and a pixel driving circuit connected to the organic light emitting diode. The driving circuit GDC, the signal transmission lines SGL, and the pixel driving circuit may be included in the circuit layer DP-CL shown in FIG. 2.

The driving circuit GDC may include a scan driving circuit. The scan driving circuit GDC may include a plurality of thin film transistors formed through the same process as the driving circuit of the pixels PX, for example, a low temperature polycrystalline silicon (LTPS) process or a low temperature polycrystalline oxide (LTPO) process.

The signal transmission lines SGL may include scan lines GL, data lines DL, a power line PL, and a control signal line CSL. Each of the scan lines GL may be connected to one or more corresponding pixels PX among the pixels PX, and each of the data lines DL may be connected to one or more corresponding pixels PX among the pixel PX. The power line PL may be connected to the pixels PX. The control signal line CSL may provide control signals to the scan driving circuit GDC. Signal pads DP-PD may be connected to ends of the signal transmission lines SGL.

FIG. 5 is a plan view showing the input sensing part ISL according to some embodiments of the present disclosure. According to some embodiments, the electronic device DD may include the input sensing part ISL, signal lines SL1 and SL2, an electronic part IC, and a reinforcing member ST. The input sensing part ISL may include sensing electrodes E1-1 to E1-5 and E2-1 to E2-4, and the signal lines SL1 and SL2 may be electrically connected to the sensing electrodes E1-1 to E1-5 and E2-1 to E2-4. The signal lines SL1 and SL2 may include, respectively, first portions P1-1 and P1-2 extending in a first direction, and may include, respectively, second portions P2-1 and P2-2 extending in a second direction that is different from the first direction. The electronic part IC might not overlap the signal lines SL1 and SL2. The reinforcing member ST may overlap the first portions P1-1 and P1-2 while not overlapping the second portions P2-1 and P2-2.

The input sensing part ISL may include a sensing area IS-DA and a non-sensing area IS-NDA. The sensing area IS-DA may correspond to the display area DP-DA (refer to FIG. 4) of the display panel DP. The non-sensing area IS-NDA may correspond to the non-display area DP-NDA (refer to FIG. 4) of the display panel DP.

The input sensing part ISL may be located on the first non-bending portion NBA1. The reinforcing member ST and the electronic part IC may be located on the second non-bending portion NBA2. The input sensing part ISL and the reinforcing member ST may be spaced apart from each other with the bending portion BA interposed therebetween. The input sensing part ISL and the electronic part IC may be spaced apart from each other with the bending portion BA interposed therebetween.

The input sensing part ISL may include the sensing electrodes E1-1 to E1-5 and E2-1 to E2-4. The sensing electrodes E1-1 to E1-5 and E2-1 to E2-4 may include first sensing electrodes E1-1 to E1-5, and second sensing electrodes E2-1 to E2-4 that are insulated from the first sensing electrodes E1-1 to E1-5 while crossing the first sensing electrodes E1-1 to E1-5. The first sensing electrodes E1-1 to E1-5 and the second sensing electrodes E2-1 to E2-4 may be located in the sensing area IS-DA.

Each of the first sensing electrodes E1-1 to E1-5 and the second sensing electrodes E2-1 to E2-4 may have a mesh shape through which openings are defined. One of the first sensing electrodes E1-1 to E1-5 and the second sensing electrodes E2-1 to E2-4 may have an integral shape. The first sensing electrodes E1-1 to E1-5 may include a sensing portion SP1 and an intermediate portion CP1.

The second sensing electrodes E2-1 to E2-4 may include a sensing pattern SP2 and a bridge pattern CP2 (or a connection pattern). Two sensing patterns SP2 that are adjacent to each other may be connected by two bridge patterns CP2, however, the number of the bridge patterns should not be limited thereto or thereby.

The signal lines SL1 and SL2 may include, respectively, first signal lines SL1 and second signal lines SL2, which are located in the non-sensing area IS-NDA. The first signal lines SL1 may be electrically connected to the first sensing electrodes E1-1 to E1-5. The second signal lines SL2 may be electrically connected to the second sensing electrodes E2-1 to E2-4.

One of the first signal lines SL1 and the second signal lines SL2 may transmit a transmit signal to a corresponding sensing electrode to sense an external input from an external circuit, and the other of the first signal lines SL1 and the second signal lines SL2 may transmit a variation in capacitance between the first sensing electrodes E1-1 to E1-5 and the second sensing electrodes E2-1 to E2-4 to the external circuit as a receive signal. In FIG. 5, five first signal lines SL1 are illustrated, and each of the first signal lines SL1 may have an integral shape. In FIG. 5, four second signal lines SL2 are illustrated, and each of the second signal lines SL2 may have an integral shape. However, this is merely one example. Each of the first signal line SL1 may include plural portions connected to each other through a plurality of contact holes. Each of the second signal line SL2 may include plural portions connected to each other through a plurality of contact holes. One end of the respective signal lines SL1 and SL2 may be connected to pads ISL-PD.

According to some embodiments, the signal lines SL1 and SL2 may include the first portions P1-1 and P1-2 and the second portions P2-1 and P2-2. The first signal line SL1 may include the first portion P1-1 and the second portion P2-1. The second signal line SL2 may include the first portion P1-2 and the second portion P2-2. The first portions P1-1 and P1-2 may extend in a first extension direction that is substantially parallel to the first directional axis DR1. The second portions P2-1 and P2-2 may extend in a second extension direction that is different from the first extension direction. In FIG. 5, the second extension direction is substantially parallel to the second directional axis DR2, and the second portions P2-1 and P2-2 are substantially parallel to the second directional axis DR2. However, this is merely one example, and the second extension direction should not be limited thereto or thereby.

An included angle θ0 between the first extension direction and the second extension direction may be equal to or greater than about 90°, and may be equal to or smaller than about 180°. The included angle θ0 between the first extension direction and the second extension direction may be an included angle θ0 respectively between the first portions P1-1 and P1-2 and the second portions P2-1 and P2-2. When viewed in the plane defined by the first directional axis DR1 and the second directional axis DR2, the included angle θ0 respectively between the first portions P1-1 and P1-2 and the second portions P2-1 and P2-2 may be equal to or greater than about 90° and may be equal to or smaller than about 180°. The first portions P1-1 and P1-2 and the second portions P2-1 and P2-2 may be designed not to overlap the electronic part IC. In FIG. 5, the first portions P1-1 and P1-2 are substantially perpendicular to the second portions P2-1 and P2-2. That is, the included angle θ0 respectively between the first portions P1-1 and P1-2 and the second portions P2-1 and P2-2 may be about 90°, however, this is merely one example. The included angle θ0 between the first portions P1-1 and P1-2 and the second portions P2-1 and P2-2 should not be limited thereto or thereby.

The first portions P1-1 and P1-2 and the second portions P2-1 and P2-2 may be located in the second non-bending portion NBA2. The electronic part IC, and the reinforcing member ST surrounding the electronic part IC, may be located in the second non-bending portion NBA2. The electronic part IC might not overlap the signal lines SL1 and SL2. In the second non-bending portion NBA2, the electronic part IC might not overlap the first portions P1-1 and P1-2 and the second portions P2-1 and P2-2. The electronic part IC may be, but not limited to, a driving chip. The reinforcing member ST may protect components of the electronic device DD. The reinforcing member ST may include a stainless steel. For example, the reinforcing member ST may include an alloy of iron and chromium. As described above, the other end of the second non-bending portion NBA2 may be coupled with the circuit board, and thus, a pressure may be applied to the display panel. The reinforcing member ST may protect the components of the electronic device DD from external stress, such as pressure.

When viewed in the plane defined by the first directional axis DR1 and the second directional axis DR2, the electronic part IC may have a rectangular shape with two short sides and two long sides. The first signal line SL1 may be located adjacent to one side edge IC-S1 of the electronic part IC. The second signal line SL2 may be located adjacent to the other side edge IC-S2 of the electronic part IC. The one side edge IC-S1 and the other side edge IC-S2 of the electronic part IC may correspond to the two short sides, respectively.

FIG. 6 is a plan view showing the reinforcing member ST according to some embodiments of the present disclosure. The reinforcing member ST may include one or more inner side surfaces ST-IF adjacent to the electronic part IC, and one or more outer side surfaces ST-OF opposite to the inner side surfaces ST-IF. One long side of the electronic part IC may be located adjacent to one of the inner side surfaces ST-IF of the reinforcing member ST, and the other long side of the electronic part IC may be spaced apart from the one of the inner side surfaces ST-IF of the reinforcing member ST with the aforementioned first/one long side of the electronic part IC being interposed therebetween.

One outer side surface of the outer side surfaces ST-OF may be provided with groove portions HH1 and HH2 defined in. The outer side surface ST-OF may be provided with the groove portions HH1 and HH2 that are concavely defined in a direction toward the inner side surfaces ST-IF. Edges of the outer side surfaces ST-OF between the groove portions HH1 and HH2 may be substantially parallel to the second directional axis DR2 in the outer side surface ST-OF in which the groove portions HH1 and HH2 are defined.

The groove portions HH1 and HH2 may be concavely defined in the first directional axis DR1 in the plane defined by the first directional axis DR1 and the second directional axis DR2. The groove portions HH1 or HH2 may include, respectively, two short sides S1-1 and S1-2 or S2-1 and S2-2, and may include, respectively, one long side L1 or L2. The two short sides may be substantially perpendicular to the outer side surface ST-OF in which the groove portions HH1 and HH2 are defined. One long side L1 or L2 may be substantially perpendicular to the two short sides S1-1 and S1-2 or S2-1 and S2-2.

The groove portions HH1 and HH2 may include a first groove portion HH1 and a second groove portion HH2, which are spaced apart from each other in the second directional axis DR2. The first groove portion HH1 may include the two short sides S1-1 and S1-2 substantially parallel to the first directional axis DR1, and the one long side L1 substantially parallel to the second directional axis DR2. The second groove portion HH2 may include the two short sides S2-1 and S2-2 substantially parallel to the first directional axis DR1, and the one long side L2 substantially parallel to the second directional axis DR2. For example, each of the long sides L1 and L2 may be spaced apart from the inner side surface ST-IF by about 1 mm or more. That is, and for example, a minimum separation distance between the groove portions HH1 and HH2 and the inner side surface ST-IF may be equal to or greater than about 1 mm. The minimum separation distance may be a straight distance on the plane defined by the first directional axis DR1 and the second directional axis DR2.

When viewed in the plane defined by the first directional axis DR1 and the second directional axis DR2, the reinforcing member ST may overlap the first portions P1-1 and P1-2 of the signal lines SL1 and SL2 while not overlapping the second portions P2-1 and P2-2 of the signal lines SL1 and SL2. The first portions P1-1 and P1-2 may cross the long sides L1 and L2. The second portions P2-1 and P2-2 may be spaced apart from the long sides L1 and L2 and the short sides S1-1, S1-2, S2-1, and S2-2.

The first signal line SL1 may overlap the first groove portion HH1. The second signal line SL2 may overlap the second groove portion HH2. The first portion P1-1 of the first signal line SL1 may cross the long side L1 of the first groove portion HH1. The first portion P1-2 of the second signal line SL2 may cross the long side L2 of the second groove portion HH2.

In a conventional electronic device, signal lines located in an area (e.g., a predetermined area) overlap a reinforcing member. In a display panel, a width of a bending portion is smaller than a width of a first non-bending portion, and an area in which the signal lines are located may be decreased. The reinforcing member is located to protect the display panel from stresses applied to a periphery of an electronic part, and first portions and second portions of the signal lines overlap the reinforcing member. As an area in which the second portions overlap the reinforcing member is greater than an area in which the first portions overlap the reinforcing member, defects, such as a short circuit, may occur in the second portions of the signal lines. The defects of the signal lines reduce reliability of the electronic device.

In the electronic device DD according to some embodiments, the signal lines SL1 and SL2 may respectively include the first portions P1-1 and P1-2 extending parallel to the first directional axis DR1, and may respectively include the second portions P2-1 and P2-2 extending parallel to the second directional axis DR2. The first portions P1-1 and P1-2 and the second portions P2-1 and P2-2 might not overlap the electronic part IC. The reinforcing member ST may overlap the first portions P1-1 and P1-2 of the signal lines SL1 and SL2 while not overlapping the second portions P2-1 and P2-2 of the signal lines SL1 and SL2. Accordingly, the defects of the signal lines SL1 and SL2 may be reduced, and the reliability of the electronic device DD may be improved.

The reinforcing member ST may be symmetrical (e.g., left and right) on the plane defined by the first directional axis DR1 and the second directional axis DR2. The reinforcing member ST may be symmetrical with respect to an imaginary center line LN crossing a center thereof on the plane defined by the first directional axis DR1 and the second directional axis DR2. The imaginary center line LN may be substantially parallel to a direction in which the first directional axis DR1 extends.

When viewed in the plane defined by the first directional axis DR1 and the second directional axis DR2, a length of the short sides S1-1 and S1-2 of the first groove portion HH1 may be substantially the same as a length of the short sides S2-1 and S2-2 of the second groove portion HH2. A length of the long side L1 of the first groove portion HH1 may be substantially the same as a length of the long side L2 of the second groove portion HH2. According to some embodiments, however, the length of the long side L1 of the first groove portion HH1 may be different from the length of the long side L2 of the second groove portion HH2.

A side surface edge S-ED of the outer side surface, in which the groove portions HH1 and HH2 are not defined among the outer side surfaces ST-OF of the reinforcing member ST, may include a first edge ED1 and a second edge ED2. The first edge ED1 may be substantially parallel to the first directional axis DR1, and the second edge ED2 may extend from the first edge ED1. The second edge ED2 may extend in a direction that is inclined with respect to the first edge ED1. An angle θ1 between the first edge ED1 and the second edge ED2 may be greater than about 0° and smaller than about 90°. In a case where the angle θ1 between the first edge ED1 and the second edge ED2 is about 0°, the second edge ED2 may be substantially parallel to the first directional axis DR1. In a case where the angle θ1 between the first edge ED1 and the second edge ED2 is about 90°, the first edge ED1 and the second edge ED2 may be substantially perpendicular to each other. Meanwhile, the angle θ1 between the first edge ED1 and the second edge ED2 should not be limited to that shown in FIG. 6. In addition, one of the first edge ED1 and the second edge ED2 may be omitted.

Referring to FIG. 7, the electronic part IC may have a square pillar shape with opposite surfaces. The square pillar shape may be a shape in which one surface having a rectangular shape is opposite the other surface of the rectangular shape. The one surface and the other surface may be upper and lower surfaces of the square pillar shape, respectively. The one surface and the other surface may be spaced apart from each other in the third directional axis DR3. The square pillar shape may include four side surfaces IC-SF connecting the one surface and the other surface, and three side surfaces IC-SF among the four side surfaces IC-SF may be located adjacent to the inner side surfaces ST-IF of the reinforcing member ST.

A cover member CM may be located on the electronic part IC. The cover member CM may include an antistatic agent. The cover member CM may cover one surface of the electronic part IC. When viewed in the plane defined by the first directional axis DR1 and the second directional axis DR2, the cover member CM may have an area that is greater than an area of the electronic part IC. An edge CM-ED of the cover member CM may overlap the reinforcing member ST in the plane defined by the first directional axis DR1 and the second directional axis DR2. A portion of the cover member CM may overlap the reinforcing member ST in the plane defined by the first directional axis DR1 and the second directional axis DR2.

Figure 8:
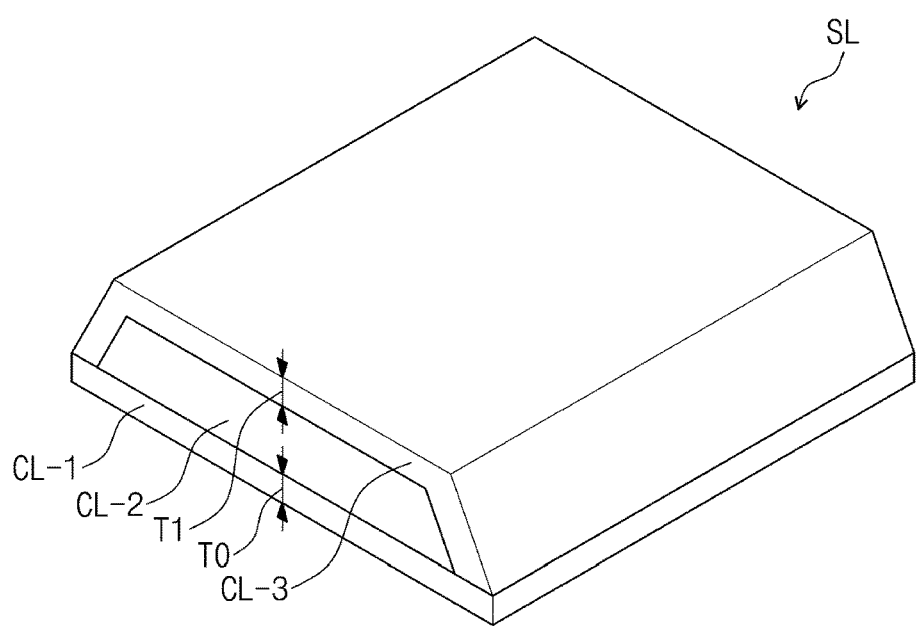
FIG. 8 is a perspective view showing a signal line according to some embodiments of the present disclosure.
Figure 9:
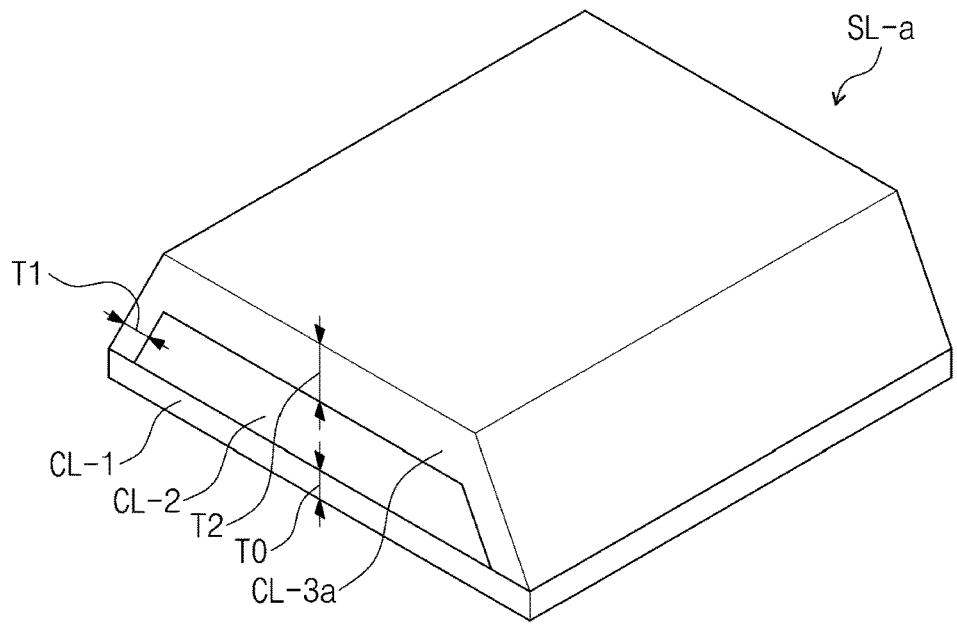
FIG. 9 is a perspective view showing a signal line according to some embodiments of the present disclosure.
Figure 10:
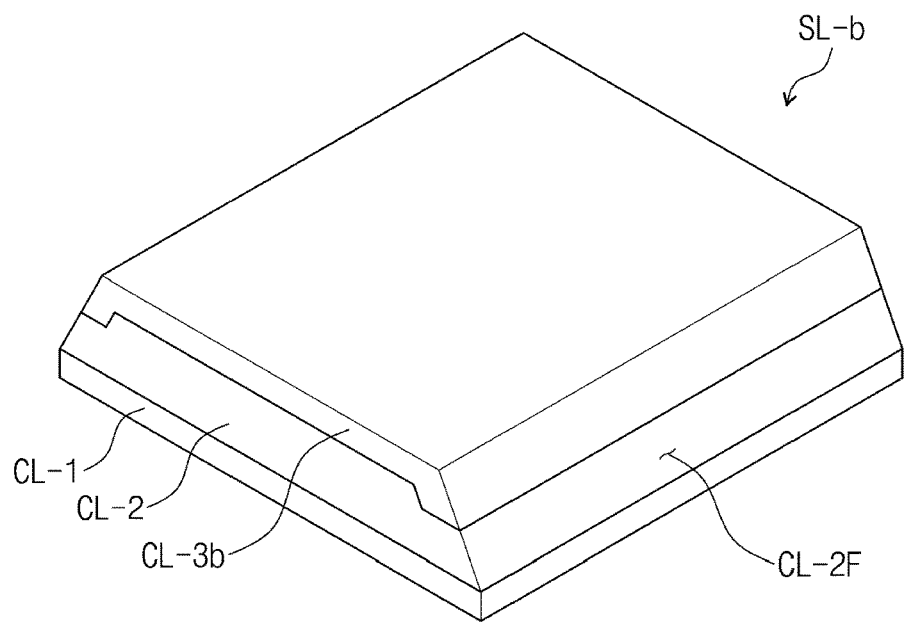
FIG. 10 is a perspective view showing a signal line according to some embodiments of the present disclosure.

FIGS. 8, 9, and 10 are perspective views showing signal lines SL, SL-a, and SL-b, respectively. The signal lines SL, SL-a, and SL-b shown in FIGS. 8 to 10 may be at least one of the first signal line SL1 and the second signal line SL2.

Referring to FIGS. 8 to 10, the signal lines SL, SL-a, and SL-b may include a first conductive layer CL-1, a second conductive layer CL-2 located on the first conductive layer CL-1, and third conductive layers CL-3, CL-3a, and CL-3b located on the second conductive layer CL-2. According to some embodiments, the third conductive layers CL-3, CL-3a, and CL-3b may cover at least a portion of a side surface CL-2F (refer to FIG. 10) of the second conductive layer CL-2. As an example, the third conductive layers CL-3, CL-3a, and CL-3b may cover about 30% or more of a total area of the side surface CL-2F (refer to FIG. 10) of the second conductive layer CL-2. However, this is merely one example, and the amount of the covered area with respect to the total area of the side surface CL-2F (refer to FIG. 10) of the second conductive layer CL-2 should not be limited thereto.

In addition, the third conductive layers CL-3, CL-3a, and CL-3b may cover an upper surface of the second conductive layer CL-2. The third conductive layers CL-3, CL-3a, and CL-3b may be located on the upper surface of the second conductive layer CL-2. The first conductive layer CL-1 may be located on a lower surface of the second conductive layer CL-2. The upper and lower surfaces of the second conductive layer CL-2 may be opposite each other. The side surface CL-2F of the second conductive layer CL-2 may connect the upper surface of the second conductive layer CL-2 to the lower surface of the second conductive layer CL-2.

In FIGS. 8 and 9, the third conductive layers CL-3 and CL-3a entirely cover the side surface CL-2F of the second conductive layer CL-2. In FIG. 10, the third conductive layer CL-3b covers a portion of the side surface CL-2F of the second conductive layer CL-2.

Figure 12:
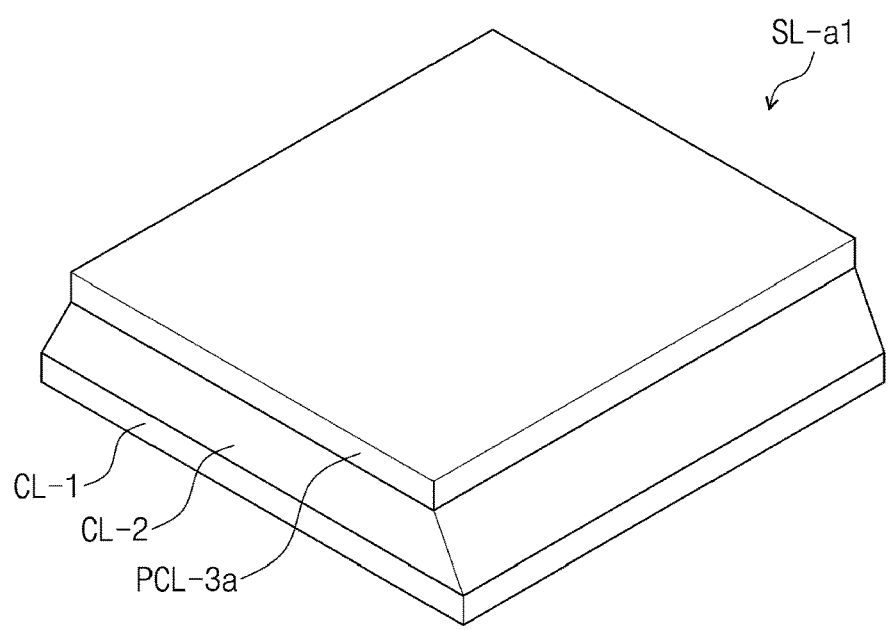
FIG. 12 is a perspective view schematically showing a method of manufacturing a signal line according to some embodiments of the present disclosure.

A comparative electronic device includes first, second, and third conductive layers sequentially stacked, and a side surface of the second conductive layer is exposed (refer to FIG. 12). The exposed side surface may be vulnerable to a manufacturing environment of signal lines, and to a material used in a manufacturing process of the signal lines, and thus, defects may be caused in the signal lines. Such defects in the signal lines may reduce the reliability of the electronic device.

According to some embodiments, the signal lines SL, SL-a, SL-b of the electronic device DD may include the first conductive layer CL-1, the second conductive layer CL-2, and the third conductive layers CL-3, CL-3a, and CL-3b, which are sequentially stacked one on another. The third conductive layers CL-3, CL-3a, and CL-3b may cover at least a portion of the side surface of the second conductive layer CL-2. As at least the portion of the side surface of the second conductive layer CL-2 is covered, potential defects in the signal lines SL, SL-a, and SL-b may be reduced or prevented, and the reliability of the electronic device may be improved.

Figure 11:
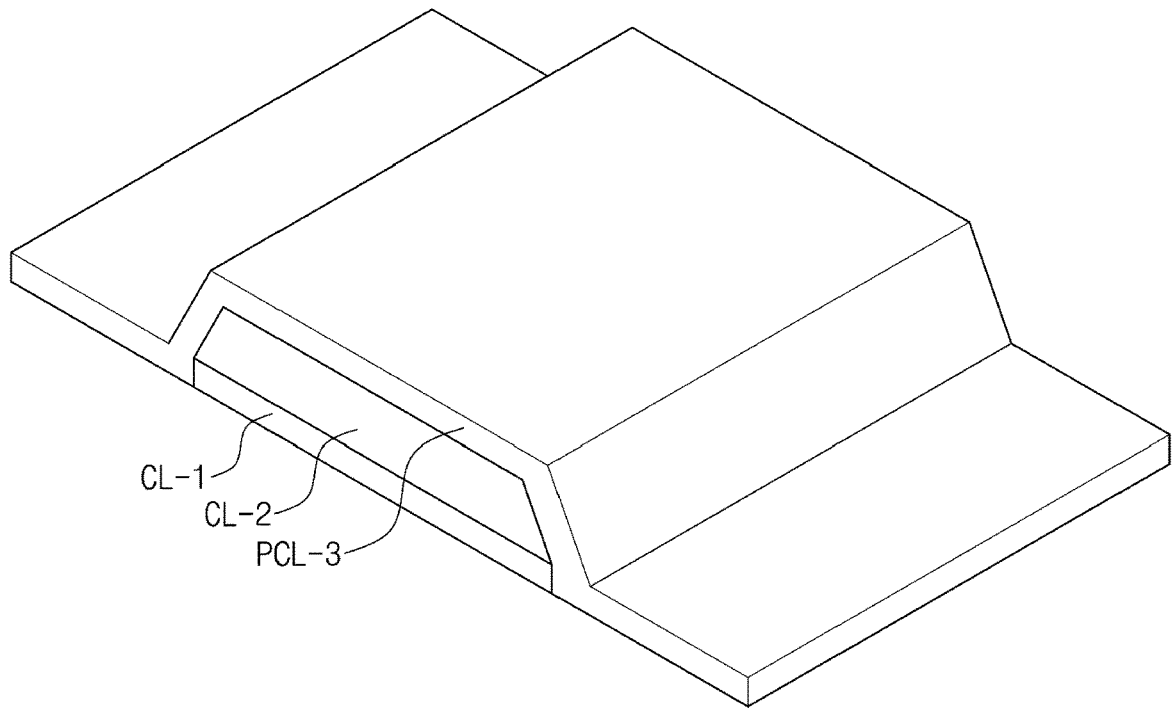
FIG. 11 is a perspective view schematically showing a method of manufacturing a signal line according to some embodiments of the present disclosure.
Figure 13:
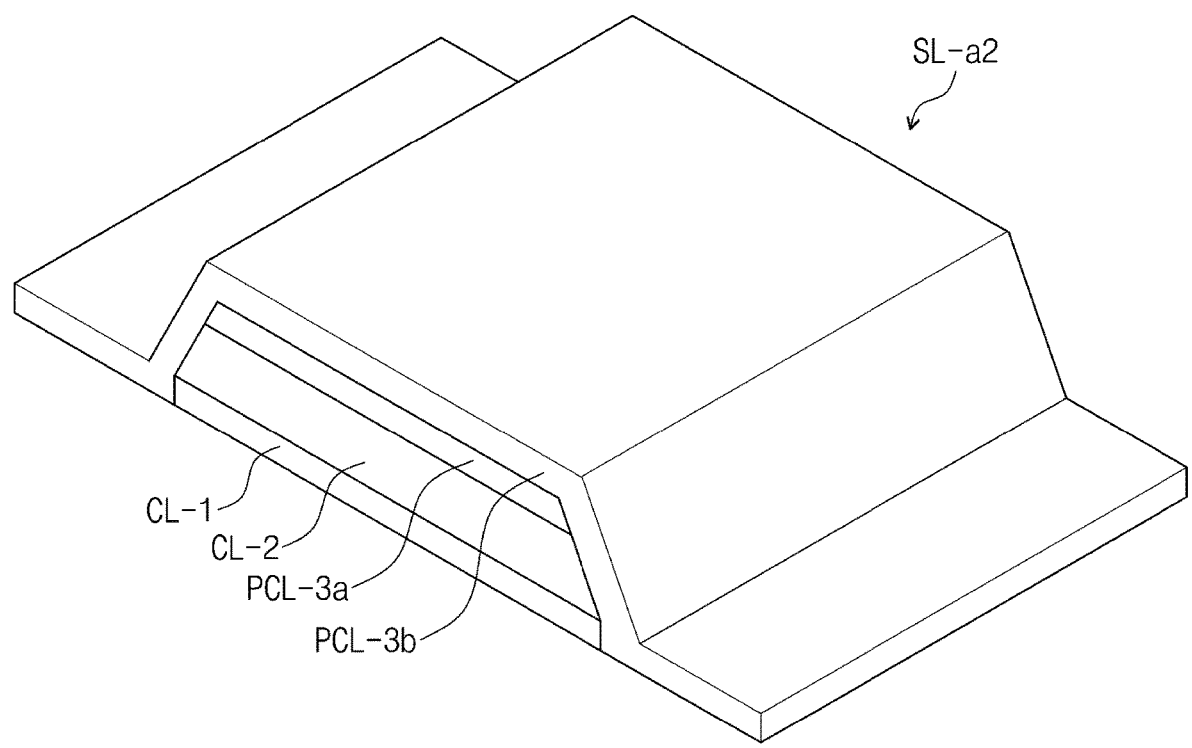
FIG. 13 is a perspective view schematically showing a method of manufacturing a signal line according to some embodiments of the present disclosure.

FIGS. 11 to 13 show a manufacturing method of the signal lines SL, SL-a, and SL-b. Hereinafter, the manufacturing method of the signal lines SL, SL-a, and SL-b will be described with reference to FIGS. 11 to 13 and FIGS. 8 to 10.

The signal line SL shown in FIG. 8 may be formed by depositing the third conductive layer CL-3 on an entire surface of the second conductive layer CL-2 in the manufacturing method of the signal line SL. Referring to FIG. 11, a preliminary third conductive layer PCL-3 may be deposited to entirely cover the side surface CL-2F of the second conductive layer CL-2. The third conductive layer CL-3 formed from the preliminary third conductive layer PCL-3 may entirely cover the side surface CL-2F of the second conductive layer CL-2. Referring to FIG. 8, the third conductive layer CL-3 may have a thickness T1 that is substantially the same as a thickness T0 of the first conductive layer CL-1. The thickness T1 of the third conductive layer CL-3 and the thickness T0 of the first conductive layer CL-1 may indicate a thickness measured in the thickness direction of the electronic device DD.

Differently, the signal line SL-a shown in FIG. 9 may be formed by depositing the third conductive layer CL-3a twice in the manufacturing method of the signal line SL-a. Referring to FIG. 12, a preliminary third-first conductive layer PCL-3a may be provided on the second conductive layer CL-2 to overlap an edge of the second conductive layer CL-2, and thus, a preliminary signal line SL-a1 may be formed. Then, as shown in FIG. 13, a preliminary third-second conductive layer PCL-3b may be deposited to form a preliminary signal line SL-a2. The preliminary third-second conductive layer PCL-3b may entirely cover the side surface CL-2F of the second conductive layer CL-2. The third conductive layer CL-3a may be formed from both of the preliminary third-first conductive layer PCL-3a and the preliminary third-second conductive layer PCL-3b. The preliminary third-first conductive layer PCL-3a and the preliminary third-second conductive layer PCL-3b may include the same material as each other. In FIG. 9, the third conductive layer CL-3a may have a thickness T2, which may be two times greater than a thickness T0 of the first conductive layer CL-1. However, this is merely one example, and a ratio of the thickness T2 of the third conductive layer CL-3a to the thickness T0 of the first conductive layer CL-1 should not be limited thereto or thereby.

The signal line SL-b shown in FIG. 10 may be formed by adjusting a thickness of a photoresist provided to form the third conductive layer CL-3b in the manufacturing method of the signal line SL-b. As shown in FIG. 13, the signal line SL-b may be formed by entirely depositing the preliminary third-second conductive layer PCL-3b on the preliminary third-first conductive layer PCL-3a and by adjusting the thickness of the photoresist used for a patterning process. The third conductive layer CL-3b may be formed by making the thickness of the photoresist on the upper surface of the second conductive layer CL-2 different from the thickness of the photoresist on the side surface CL-2F of the second conductive layer CL-2.

For example, the preliminary third-second conductive layer PCL-3b is more etched on the side surface CL-2F of the second conductive layer CL-2 than on the top surface of the second conductive layer CL-2. To this, the photoresist on the upper surface of the second conductive layer CL-2 may be thicker than the photoresist on the side surface CL-2F of the second conductive layer CL-2. However, this is merely one example, and a method of forming the third conductive layer CL-3b is not limited thereto. In addition, the manufacturing methods of the signal lines SL, SL-a, and SL-b shown in FIGS. 8 to 10 should not be limited to those shown in FIGS. 11 to 13.

The first conductive layer CL-1 and the third conductive layer CL-3 may include the same material as each other. The second conductive layer CL-2 may include a material that is different from that of the first conductive layer CL-1 and the third conductive layer CL-3. In some embodiments, the first conductive layer CL-1 and the third conductive layer CL-3 may include titanium, and the second conductive layer CL-2 may include aluminum.

The electronic device may include the display panel that is bendable, the input sensing part, the electronic part, and the reinforcing member, and the input sensing part, the electronic part, and the reinforcing member may be located on the display panel. The input sensing part may include the sensing electrode, and the sensing electrode may be connected to the signal line. The signal line might not overlap the electronic part, and the reinforcing member may surround the electronic part. The signal line may be designed not to overlap the electronic part, and may include the first portion and the second portion, which extend in different directions. The reinforcing member may be provided with the groove portion defined therein, and the groove portion may overlap the first portion, and might not overlap the second portion. In the electronic device including the reinforcing member in which the groove portion that does not overlap the second portion is defined, damage to the signal line may be reduced or prevented. Accordingly, the reliability of the electronic device may be improved.

In addition, the signal line of the electronic device may include the first conductive layer, the second conductive layer, and the third conductive layer, which are sequentially stacked. The third conductive layer may cover the upper surface of the second conductive layer, and may cover at least the portion of the side surface of the second conductive layer. Defects, such as a short circuit of the signal line, may be reduced or prevented in the signal line in which at least the portion of the side surface of the second conductive layer is covered. Accordingly, the reliability of the electronic device may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims, with functional equivalents thereof to be included therein.

What is claimed is:

1. An electronic device comprising:
   a display panel comprising a bending portion, a first non-bending portion, and a second non-bending portion spaced apart from the first non-bending portion with the bending portion interposed therebetween in a first direction;
   an input sensing part on the first non-bending portion, and comprising a sensing electrode;
   a signal line on the second non-bending portion, electrically connected to the sensing electrode, and comprising:
     a first portion extending in a first extension direction substantially parallel to the first direction; and
     a second portion extending in a second extension direction that is different from the first extension direction, and located between the sensing electrode and the first portion;
   an electronic part on the second non-bending portion, and not overlapping the signal line; and
   a reinforcing member on the second non-bending portion, only partially surrounding the electronic part in a plan view, and overlapping the first portion while not overlapping the second portion in a plan view.

2. The electronic device of claim 1, wherein the reinforcing member comprises inner side surfaces adjacent to the electronic part, and outer side surfaces respectively opposite to the inner side surfaces, one of the outer side surfaces defining a groove portion concavely defined toward a direction of a corresponding one of the inner side surfaces in a plan view.

3. The electronic device of claim 2, wherein the groove portion is defined by two short sides substantially perpendicular to the one of the outer side surfaces, and one long side substantially perpendicular to the two short sides in a plan view.

4. The electronic device of claim 3, wherein the first portion crosses the long side.

5. The electronic device of claim 2, wherein the electronic part has a rectangular pillar shape comprising four side surfaces, and
   wherein respective the inner side surfaces of the reinforcing member are adjacent to three of the four side surfaces of the electronic part.

6. The electronic device of claim 2, wherein at least one of the outer side surfaces of the reinforcing member in which the groove portion is not defined comprises a first edge extending substantially in the first direction, and a second edge inclined with respect to the first edge in a plan view, and
   wherein an inclination angle of the second edge with respect to an extension line of the first edge is greater than about 0° and smaller than about 90°.

7. The electronic device of claim 1, wherein an angle between the first extension direction and the second extension direction is equal to or greater than about 90° and smaller than about 180°.

8. The electronic device of claim 1, wherein the signal line comprises:
   a first conductive layer on the display panel;
   a second conductive layer on the first conductive layer; and
   a third conductive layer covering an upper surface of the second conductive layer and at least a portion of a side surface of the second conductive layer.

9. The electronic device of claim 8, wherein the third conductive layer covers about 30% or more of a total area of one side surface of the second conductive layer.

10. The electronic device of claim 8, wherein the second conductive layer comprises aluminum, and
    wherein the first conductive layer and the third conductive layer comprise titanium.

11. The electronic device of claim 8, wherein the third conductive layer has a thickness that is substantially equal to or greater than a thickness of the first conductive layer in a thickness direction that is normal to a plan view.

12. An electronic device comprising:
    a display panel comprising a bending portion, a first non-bending portion, and a second non-bending portion spaced apart from the first non-bending portion with the bending portion interposed therebetween in a first direction;
    an input sensing part on the first non-bending portion, and comprising a sensing electrode;

a signal line on the second non-bending portion, electrically connected to the sensing electrode, and comprising:
  a first portion extending in a first extension direction substantially parallel to the first direction; and
  a second portion extending in a second extension direction that is different from the first extension direction, and located between the sensing electrode and the first portion;
an electronic part on the second non-bending portion, and not overlapping the signal line;
a reinforcing member on the second non-bending portion, at least partially surrounding the electronic part, and overlapping the first portion while not overlapping the second portion in a plan view; and
a cover member on the electronic part and having an area that is greater than an area of the electronic part in a plan view.

13. The electronic device of claim 12, wherein an edge of the cover member overlaps the reinforcing member.

14. The electronic device of claim 1, wherein the reinforcing member comprises a stainless steel.

15. The electronic device of claim 1, wherein the reinforcing member has a shape that is symmetrical with respect to an imaginary line extending substantially parallel to the first direction and crossing a center of the reinforcing member.

16. The electronic device of claim 1, wherein the sensing electrode comprises:
  a first sensing electrode; and
  a second sensing electrode insulated from the first sensing electrode while crossing the first sensing electrode, and wherein the signal line comprises:
    a first signal line electrically connected to the first sensing electrode; and
    a second signal line electrically connected to the second sensing electrode.

17. The electronic device of claim 16, wherein the first portion of the first signal line is adjacent to a first side of the electronic part, and
  wherein the first portion of the second signal line is adjacent to a second side of the electronic part.

18. The electronic device of claim 16, wherein the reinforcing member comprises inner side surfaces adjacent to the electronic part, and outer side surfaces opposite to the inner side surfaces,
  wherein one of the outer side surfaces defines a first groove portion concavely defined therein toward a direction of a corresponding one of the inner side surfaces, and a second groove portion spaced apart from the first groove portion in a second direction,
  wherein the first signal line overlaps the first groove portion,
  wherein the second signal line overlaps the second groove portion, and
  wherein the second direction is substantially perpendicular to the first direction.

19. An electronic device comprising:
  a display panel comprising a bending portion, a first non-bending portion, and a second non-bending portion spaced apart from the first non-bending portion with the bending portion interposed therebetween in a first direction;
  an input sensing part on the first non-bending portion, and comprising a sensing electrode;
  a signal line on the second non-bending portion, electrically connected to the sensing electrode, and comprising a first portion extending in the first direction and a second portion extending in a second direction that is different from the first direction;
  an electronic part on the second non-bending portion while not overlapping the signal line; and
  a reinforcing member on the second non-bending portion, and overlapping the first portion while not overlapping the second portion in a top-down view,
  wherein the signal line comprises:
    a first conductive layer on the display panel;
    a second conductive layer on the first conductive layer; and
    a third conductive layer covering an upper surface of the second conductive layer and at least a portion of a side surface of the second conductive layer.

20. The electronic device of claim 19, wherein the reinforcing member comprises inner side surfaces adjacent to the electronic part, and outer side surfaces respectively opposite to the inner side surfaces, one of the outer side surfaces defining a groove portion concavely defined toward a direction of a corresponding one of the inner side surfaces in a plan view, the groove portion overlapping the first portion.

* * * * *